United States Patent [19]

Monticelli

[11] Patent Number: 4,542,399
[45] Date of Patent: Sep. 17, 1985

[54] FEED FORWARD DARLINGTON CIRCUIT

[75] Inventor: Dennis M. Monticelli, Fremont, Calif.

[73] Assignee: National Semiconductor Corporation, Santa Clara, Calif.

[21] Appl. No.: 468,243

[22] Filed: Feb. 22, 1983

[51] Int. Cl.[4] .................. H01L 27/02; H03K 3/26
[52] U.S. Cl. .................. 357/46; 307/315; 357/44; 357/35
[58] Field of Search .................. 357/46, 44, 35; 307/315

[56] References Cited

U.S. PATENT DOCUMENTS 4,164,747 8/1979 Gerstner .................. 357/46
4,291,319 9/1981 Carinalli .................. 357/46

FOREIGN PATENT DOCUMENTS 0028685 5/1981 Fed. Rep. of Germany ........ 357/46
0127262 10/1979 Japan .................. 307/315
0148466 11/1979 Japan .................. 307/315

Primary Examiner—Andrew J. James
Assistant Examiner—Mark Prenty
Attorney, Agent, or Firm—Gail W. Woodward; Paul J. Winters; Michael J. Pollock

[57] ABSTRACT

A Darlington output stage is shown in which the saturation voltage is substantially reduced by the incorporation of a complementary transistor. An IC form of the circuit is shown in detail.

9 Claims, 5 Drawing Figures

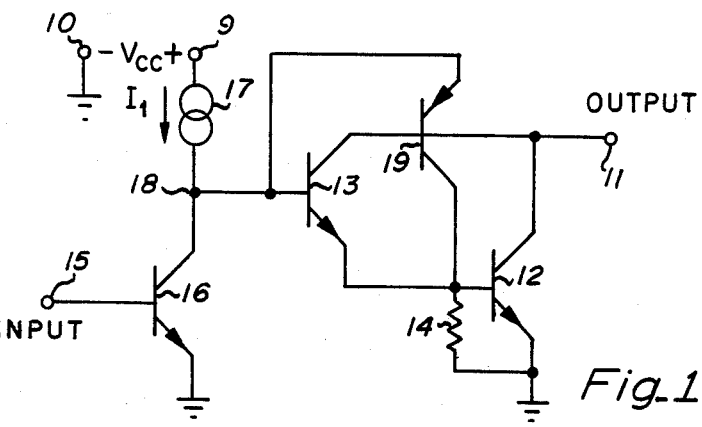
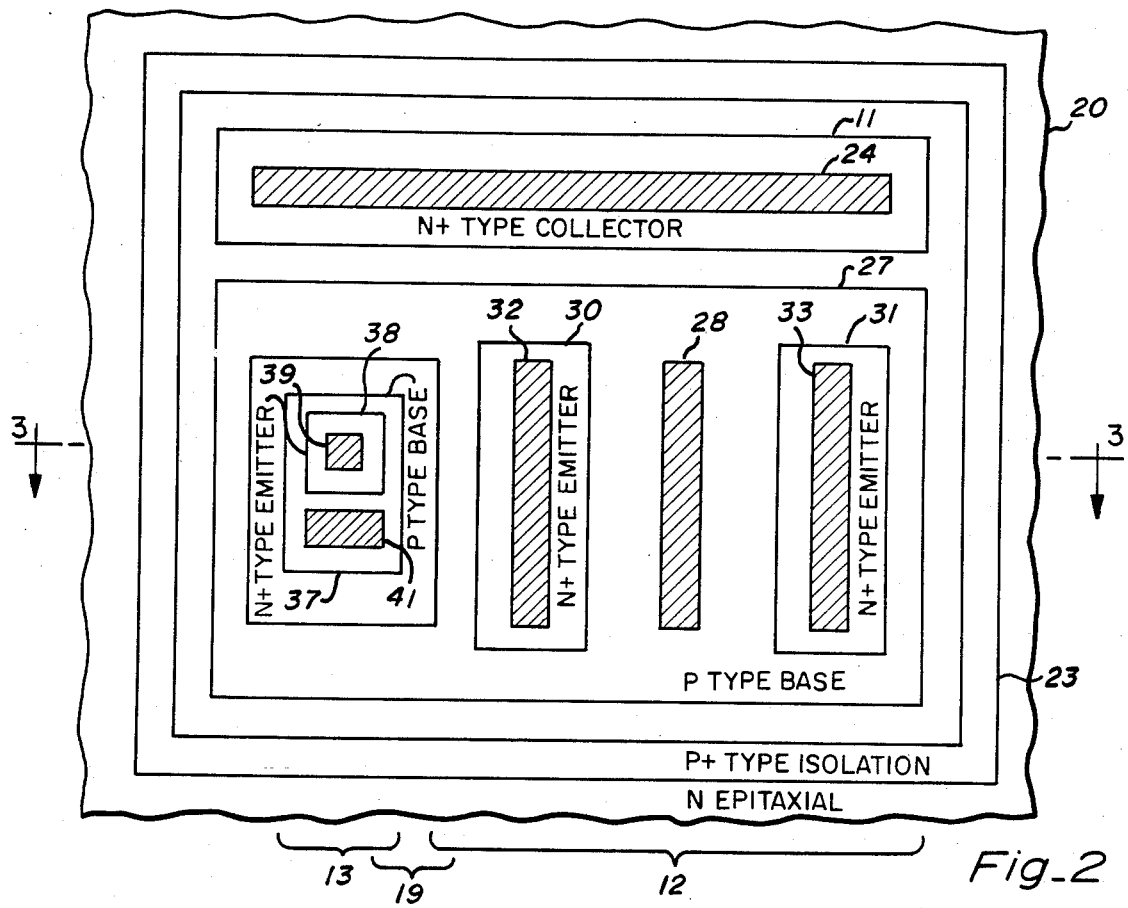
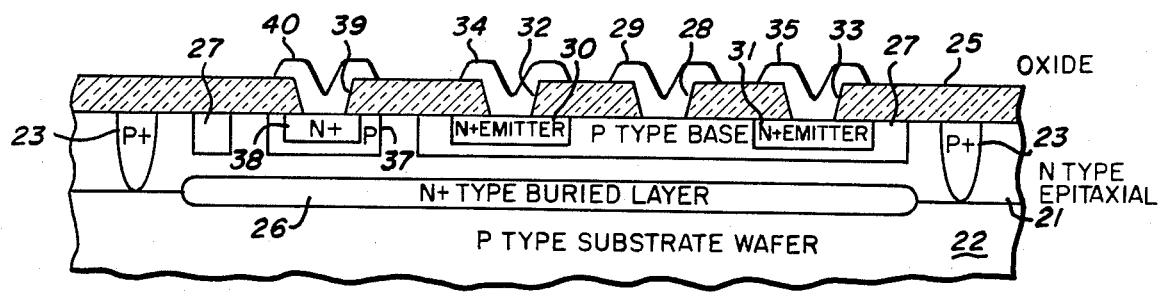

FEED FORWARD DARLINGTON CIRCUIT

BACKGROUND OF THE INVENTION

The well known Darlington-connected transistor pair is commonly used where a high current gain is desired. This transistor configuration is popular in both discrete and Integrated Circuit (IC) form in both PNP and NPN versions. One undesirable characteristic of the Darlington is the minimum output voltage under conditions of full conduction. This voltage drop is equal to $V_{BE}+V_{SAT}$ and is typically 1 V at 300° K. A single common emitter transistor does not have this limitation and can pull down to a minimum voltage of $V_{SAT}$. Unfortunately, this single transistor stage has far less current gain than the Darlington. Some circuit requirements dictate the need for the Darlington's gain whereas other requirements dictate the low $V_{SAT}$ of the single common emitter stage. So far, no bipolar transistor stage exists that can satisfy both types of circuit needs simultaneously.

SUMMARY OF THE INVENTION

It is the object of the invention to create a Darlington-connected transistor circuit that behaves in all respects like a conventional Darlington connection for output voltages above $V_{BE}+V_{SAT}$ and behaves like a conventional single common emitter stage for output voltages below $V_{BE}+V_{SAT}$.

It is a still further object of the invention to include a lateral PNP transistor in a Darlington-connected NPN pair where the PNP is merged into the NPN structures.

These and other objects are achieved as follows. A pair of NPN transistors are connected into a Darlington configuration. A PNP device has its emitter connected to the input terminal its base connected to the output terminal and its collector connected to the input transistor emitter. Normally the Darlington pair acts in the conventional manner. However, when the output voltage falls to where the input transistor saturates, the PNP starts to conduct and will drive base current into the output NPN transistor. As the output voltage falls still further the output NPN will be driven into saturation and the output voltage will drop to $V_{SAT}$. In other words, the circuit operates in the high gain Darlington mode normally but will have the low saturation voltage of a single transistor.

In either its IC or discrete version the PNP transistor can be built into the Darlington-connected NPN pair as a lateral transistor that merges into the structure without adding any additional parts.

BRIEF DESCRIPTION OF THE DRAWING

FIG. 1 is a schematic diagram of the circuit of the invention.

FIG. 2 is a topographical showing of a fragment of an IC that employs the invention.

FIG. 3 is a cross section of the IC of FIG. 2.

DESCRIPTION OF THE INVENTION

Figure 4A:
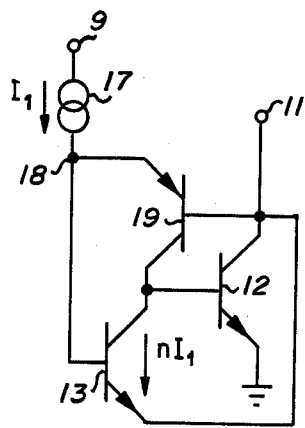
FIG. 4A is a schematic diagram showing the input transistor in its inverted condition.

FIG. 1 shows the elements of the invention. A $V_{cc}$ power supply is connected + to terminal 9 and − to ground terminal 10. Output terminal 11 is the uncommitted collector connection of Darlington-connected transistors 12 and 13. Resistor 14 returns the base of transistor 12 to its emitter. Input terminal 15, operating through inverter transistor 16, which operates with current source load 17, drives node 18 which is the input to the Darlington connected pair.

As a Darlington pair transistors 12 and 13 would ordinarily have a saturation voltage equal to $V_{BE12}+V_{SAT13}$. This would typically be about one volt at 300° K. The inclusion of "feed-forward" PNP transistor 19 improves the circuit in the following manner.

Current source 17 supplies $I_1$ to node 18 which will therefore be pulled up to an extent determined by the conduction in transistor 16. As node 18 rises transistor 13 will eventually go into saturation at which point its current gain collapses and its emitter supplies only enough current to hold terminal 11 to $V_{BE12}$ plus $V_{SAT13}$. However, the inclusion of transistor 19 alters this behavior. PNP transistor 19 is normally off but turns on just as transistor 13 begins to saturate in a manner that redirects or "feeds forward" the drive current $I_1$, around transistor 13 and directly into the base of transistor 12. In fact transistor 19 can conduct to force transistor 12 into saturation so that terminal 11 will drop to one $V_{SAT}$. This is typically about 0.3 volt which represents a substantial improvement over the Darlington pair alone. The current gain, or B, in the "feed forward" mode is $B_{12}$ whereas the gain in the Darlington mode is $B_{12} \times B_{13}$.

FIG. 2 shows the IC form of the invention topographically in a silicon fragment 20 using conventional PN junction isolation monolithic IC construction. FIG. 3 is a cross section of the IC fragment of FIG. 2 taken at the line 3—3. The surface being observed in FIG. 2 is an N type layer of silicon 21 epitaxed or deposited upon a P type substrate wafer 22. The contact metallization is not shown in FIG. 2 so that the transistor elements can be clearly seen. A P type isolation ring 23 is diffused through the epitaxial layer to PN junction isolate a tub of the deposited N type material.

Contact 11 represents an N+ diffusion which makes ohmic contact to the isolated N type tub inside ring 23. Cut 24 of FIG. 2 represents a contact cut in the oxide film 25 that covers the silicon. Cut 24 provides a means for metallization to make connection to the epitaxial tub lying inside ring 23.

While not seen in FIG. 2 the structure is located on top of an N+ buried layer 26 which extends over the P type substrate between substrate 22 and the epitaxial layer 21.

Region 27 is a P type transistor base diffusion that extends into the N type silicon. This will be the base of transistor 12. Contact to the base silicon is by way of cut 28 which will accommodate metallization 29.

N+ diffusions 30 and 31 comprise together the emitter of transistor 12. Oxide cuts 32 and 33 provide contact with emitter metallizations 34 and 35. It is to be understood that metallization extensions (not shown) will join 34 and 35 together and connect them to ground as shown in FIG. 1.

Region 37 is a P type base diffusion for transistor 13. Region 38 is an N+ diffusion into base 37 to create the emitter of transistor 13. Contact cut 39 in the IC oxide provides for emitter metallization 40. Contact cut 41 provides a base connection for the metallization (not shown) on transistor 13. This is node 18 of FIG. 1.

It can be seen that base region 27 is extended to completely surround base region 37. These P type regions are laterally separated by an N type segment of the isolated epitaxial tub. Thus a lateral transistor 19 is created the base of which is part of the NPN transistor collectors. The collector of transistor 19 is actually the base of transistor 12 and the emitter of transistor 19 is actually the base of transistor 13. Thus transistor 19 is merged into transistors 12 and 13 without adding any parts. If desired, the extension of base region 27 that surrounds region 37 could be dispensed with and the lateral transistor action achieved by the flanking parts. However, this would yield a lower efficiency lateral transistor action so the construction shown is preferred.

When the base of transistor 13 is pulled above its collector by one $V_{BE}$ and it saturates, transistor 19 is turned on so that a portion of $I_1$ will flow in transistor 19. Thus transistor 13 is bypassed and the node 18 current forced into the base of transistor 12. By this mechanism transistor 12 can be driven fully into saturation so that the potential of terminal 12 is lowered. The saturation voltage thereby drops to that value normally associated with the collector-to-emitter saturation voltage of a single NPN transistor.

It will be noted that transistor 12 is scaled up in area with respect to transistor 13 so that an idealized Darlington ratio can exist. While transistor 12 is shown having two emitter diffusions flanking a single base contact, additional interdigitated contacts can be employed to achieve any reasonable desired area.

The circuit disclosed in FIG. 1 works well in the feed forward mode under ordinary conditions. However, if transistor 13 displays appreciable inverted Beta a problem can develop. This problem is illustrated in the schematic diagram of FIG. 4A. Here transistor 13 is shown with its emitter and collector electrodes reversed so that it is the circuit of FIG. 1 with the input transistor 13 inverted. This condition will occur in the feed forward mode as transistor 12 approaches saturation. Here the base of transistor 12 has risen above its collector so that transistor 13 has its emitter-collector electrodes inverted as shown. When node 18 rises sufficiently above the terminal 11 potential a fraction n of $I_1$ will flow in transistor 13 and will shunt the base drive to transistor 12. If transistor 13 has an appreciable Beta it will act to prevent transistor 12 from being driven well into its saturated region and thereby retard or even nullify the feed forward action. The value of n is proportional to the inverse Beta of transistor 13. Inverse Beta values of 0.5 or less reduce n to a small value. Under typical IC device fabrication processes the inverse Beta will be less than 0.5 so that there will be no problem.

Figure 4B:
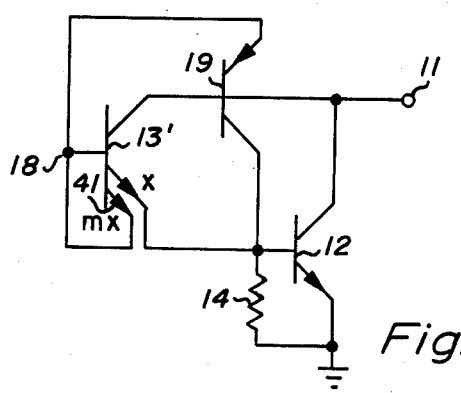
FIG. 4B is a schematic diagram of an alternative embodiment of the invention.

In the event that the invention is to be used where a fabrication process is employed that results in high inverse Beta transistors, the circuit of FIG. 4B can be employed. Here transistor 13' has an extra emitter 41 that is connected to its base. The extra emitter is made to have an area m times that of the regular emitter. When transistor 13' starts to run inverted, due to node 18 rising sufficiently above terminal 11, emitter 41 will start to act as a collector that provides a feedback path back to the transistor base. If m is made greater than 2, the inverse Beta will be kept below 0.5.

The invention has been described along with a preferred and an alternative construction. When a person skilled in the art reads the above description, other alternatives and equivalents, within the spirit and intent of the invention, will become apparent. For example, while the structure of a PN junction isolated IC is shown as a preferred embodiment, a mesa structure could be employed. Accordingly it is intended that the scope of the invention be limited only by the following claims.

I claim:

1. A Darlington transistor circuit stage having a pair of like conductivity bipolar transistors coupled together as output and driver devices with their collectors commonly connected, means coupling the emitter of said driver transistor to the base of said output transistor and means coupling the base of said driver transistor to an input terminal, said circuit comprising:
   a transistor, of complementary construction to that of said driver transistor, having a base coupled to said commonly connected collectors, a collector coupled to said emitter of said driver transistor and an emitter coupled to said base of said driver transistor.

2. The stage of claim 1 wherein said output and driver transistors are of NPN construction and said complementary transistor is of PNP construction.

3. An integrated circuit comprising:
   a substrate semiconductor wafer having a first surface and of a first conductivity type;
   a first region of the opposite conductivity type extending from said surface into said semiconductor to create an output transistor base;
   a second region of said opposite conductivity type closely adjacent to and separate from said first region and extending from said surface into said semiconductor to create a driver transistor base;
   a third region of said first conductivity type extending within the confines of said first region and part way therethrough to create an output transistor emitter;
   a fourth region of said first conductivity type extending within the confines of said second region and part way therethrough to create a driver transistor emitter; and
   means for coupling said output and driver transistor into a Darlington pair configuration whereby the relationship between said first and second regions produces a merged lateral transistor that is complementary to said output and driver transistors and said lateral transistor acts to drive said output transistor into saturation thereby lowering the voltage drop across said Darlington pair in saturation.

4. The integrated circuit of claim 3 wherein said first region is contoured to surround said second region.

5. The integrated circuit of claim 3 wherein said driver transistor is provided with an additional emitter that is shorted to its base.

6. The integrated circuit of claim 5 wherein said additional emitter in said driver transistor is larger than its original emitter.

7. The integrated circuit of claim 3 wherein said semiconductor wafer includes a substrate of said opposite conductivity type with a surface layer of said one conductivity type and an isolation diffusion extends from the wafer surface through said layer to isolate a tub of said one conductivity type into which said Darlington transistors are fabricated.

8. The integrated circuit of claim 7 wherein a buried layer of said one conductivity type is interposed between said substrate semiconductor wafer and said layer.

9. The integrated circuit of claim 8 wherein said substrate semiconductor wafer is P type, said first and second regions P type and said third and fourth regions N type.

* * * * *